United States Patent [19]
Naito et al.

[11] Patent Number: 4,819,057
[45] Date of Patent: Apr. 4, 1989

[54] SEMICONDUCTOR LIGHT-EMITTING ELEMENT

[75] Inventors: Katsuyuki Naito, Tokyo; Masayoshi Okamoto, Kawasaki; Koichi Mizushima, Kamakura; Toshio Nakayama, Fujisawa; Masami Sugiuchi, Yokohama; Akira Miura, Toride, all of Japan

[73] Assignee: Kabushiki Kaisha Toshiba, Kawasaki, Japan

[21] Appl. No.: 911,371

[22] Filed: Sep. 25, 1986

[30] Foreign Application Priority Data

Sep. 30, 1985 [JP] Japan .................. 60-214550
Sep. 30, 1985 [JP] Japan .................. 60-214551
Sep. 30, 1985 [JP] Japan .................. 60-214552
Sep. 30, 1985 [JP] Japan .................. 60-214559
Apr. 25, 1986 [JP] Japan .................. 61-96388

[51] Int. Cl.⁴ .................. H01L 29/78; H01L 33/00
[52] U.S. Cl. .................. 357/17; 357/23.15; 357/72; 264/298
[58] Field of Search .................. 357/17, 23.15, 72; 264/298

[56] References Cited

U.S. PATENT DOCUMENTS

4,757,364 7/1988 Miura et al. .................. 357/17

Primary Examiner—Robert S. Macon
Attorney, Agent, or Firm—Oblon, Fisher, Spivak, McClelland & Maier

[57] ABSTRACT

A semiconductor light-emitting element of a metal/organic film/semiconductor junction structure has a semiconductor layer, and an organic Langmuir-Blodgett thin film formed on the semiconductor layer. The thin film includes an electron donative organic monomolecular compound whose longest absorption peak wavelength in an electron transition spectrum falls within a range of 300 nm to 600 nm. A layer of metallic material is formed on the thin film.

29 Claims, 1 Drawing Sheet

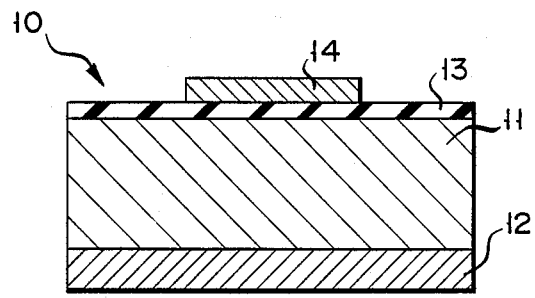

SEMICONDUCTOR LIGHT-EMITTING ELEMENT

BACKGROUND OF THE INVENTION

I. Field of the Invention

The present invention relates to a semiconductor light-emitting element having a metal/thin organic film/semiconductor junction structure and, more particularly, to such semiconductor light-emitting element having a Langmuir-Blodgett film as the thin organic film.

II. Description of the Prior Art

Semiconductor light-emitting elements, especially visible light-emitting diodes (LEDs), have been used as functional display elements in various fields Applications of these elements in printers and mini-facsimile systems have also been studied in recent years. Light-emitting diodes are expected to become more and more popular in future, with widespread use in a variety of applications.

III-V Group compound semiconductors such as GaP, GaAs, AlGaAs, and GaAsP have been used as semiconductor substrates for red, yellow, and green LEDs. These LEDs utilize recombination luminessence at an interface of a p-n junction formed in the compound semiconductor substrate by doping an impurity such as zinc, oxygen or nitrogen therein. The LEDs provide a high luminous efficacy of 0.2 to several %.

A compound semiconductor such as SiC, ZnS or ZnSe having a large forbidden band gap is used as a substrate for a blue LED. However, it is difficult to prepare SiC crystals of high quality, and it is difficult to prepare p-n junction in ZnS and ZnSe substrates. For this reason, when such a compound semiconductor is used, attempts have been made to form a metal/insulator/semiconductor (MIS) junction in place of a p-n junction, thereby preparing a light-emitting element. At present, however, MIS light-emitting elements have a lower luminous efficacy than that of p-n junction light-emitting elements. In addition, light-emitting stability of a MIS LED is also low. One of the reasons lies in the fact that it is very difficult to form a good insulating film (I layer), like a silicon oxide film used in a silicon LSI, in the compound semiconductor substrate.

In a MIS LED, the I layer must meet the following requirements. First, the I layer must have a thickness small enough to cause tunneling of electrons or holes. Second, the I layer must have uniform quality free from crystal defects such as pin holes and have a uniform thickness, over the entire surface of the S layer. Third, the I layer must be free from a trapping level that captures electrons or holes at interfaces with the metal layer or the semiconductor layer. Fourth, the I layer must not be substantially degraded by voltage application and heat accompanied by light emission.

In view of the above requirements, utilization of a thin organic film as an I layer formed by the Langmuir-Blodgett (LB) method has been proposed in recent years. Since an LB film has the potential to satisfy the above requirements to a considerable degree when organic compounds constituting the film are properly selected, LB films have received a great deal of attention.

An example of a MIS LED using an LB film as the I layer is described in "Thin Solid Films" 99, pp. 283–290, (1984) by J. Batey et al. This light-emitting element has an LB film of cadmium stearate formed on an n-type GaP layer. In general, a fatty acid such as stearic acid has poor mechanical strength and poor thermal stability. In addition, such a material has a low breakdown voltage. Therefore, a fatty acid is not really a satisfactory material for the I layer. However, a fatty acid material can be easily formed as an LB film and the LB film thickness can be controlled on the order of length of molecules (about 2.5 nm in the case of stearic acid). The light-emitting element described in the above literature used such a stearic acid LB film as the I layer. Its luminous efficacy can be increased in accordance with an increase in LB film thickness, and is maximized at a thickness of 20 to 25 nm.

In the light-emitting element having the stearic acid LB film, however, the dynamic characteristics of the element cannot be stabilized (i.e., the light emission state is unstable, and the current-voltage characteristics are unstable) and the luminous efficacy is low. In addition, the light intensity is greatly decreased after only a short period of operation.

In "Electronics Letters", 20, No. 12, pp. 489–491, (1984) by J. Batey et al., a light-emitting element having a phthalocyanine LB film on an n-type GaP layer is described. In this element, when the LB film has a thickness of 5.7 nm, a luminous efficacy reaches a maximum of $8.6 \times 10^{-3}\%$. This value can compete with that of a p-n junction LED. More specifically, the luminous efficacy of this element is the same as that of a light-emitting element having a 4-nm thick silicon oxide film on a GaP substrate, and can adequately function as a MIS injection type element. In addition, phthalocyanine has good thermal stability.

Thus, the light-emitting element having the phthalocyanine LB film is better than that having the stearic acid LB film with respect to the change in luminous efficacy with time, the luminous efficacy, and the dynamic characteristics. However, much room is left for improvement of its characteristics and properties, from the practical viewpoint.

As is apparent from the above description, conventional light-emitting elements having a metal/LB film/semiconductor junction structure cannot provide satisfactory luminous efficacy, light emission stability, dynamic characteristic stability, and operation stability over time.

SUMMARY OF THE INVENTION

It is, therefore, an object of the present invention to provide a semiconductor light-emitting element of a metal/LB film/semiconductor junction structure, wherein the above-noted characteristics are improved.

In a semiconductor light-emitting element of a metal/LB film/semiconductor junction structure according to the present invention, an LB film is made of an organic material comprising an electron donative organic monomolecular compound having predetermined electron transition spectrum characteristics. The organic monomolecular compound has the longest absorption peak wavelength in the electron transition spectrum (to be referred to as the longest absorption peak wavelength hereinafter), falling within the range of 300 to 600 nm.

In a MIS light-emitting element, if an electron donative organic compound is included in the I layer, an ionization potential at the I layer is decreased, thereby increasing the efficiency of hole injection from the M layer to the S layer. As a result, efficiency of recombination between electrons and holes is improved, increasing the luminous efficacy.

Electron affinity of the I layer is another important factor. If the electron affinity is excessively large, electrons are injected from the S layer to the M layer and a voltage cannot be applied to the I layer. The injection efficiency of holes in the S layer is thus degraded. Therefore, the organic compound constituting the I layer is preferably a material serving as an electron donor and having a small electron affinity. An energy difference between the ionization potential and the electron affinity can be estimated by the longest absorption peak wavelength in the electron transition spectrum. Thus, such an organic compound corresponds to a compound having the longest absorption peak wavelength of a small value.

Trapping in the I layer is still another factor determining luminous efficacy and dynamic characteristics of the light-emitting element. If traps exist, they interfere with hole injection. In order to decrease the number of traps, the area of the electron cloud of the electron donative compound must be increased. If the electron cloud area is increased, the energy difference between the ionization potential and the electron affinity is decreased due to delocalization of electrons. In order to decrease the number of traps in the I layer, therefore, an electron donative compound having the longest absorption peak wavelength of a large value must be used.

In summary, in order to provide an optimal MIS light-emitting element, an optimal range exists for the longest absorption peak wavelength of the electron donative organic compound used as the I layer. A range of 300 to 600 nm in the longest absorption peak wavelength for the electron donative organic compound used in the present invention is the optimal range.

BRIEF DESCRIPTION OF THE DRAWING

The accompanying drawing is a sectional view for explaining a semiconductor light-emitting element according to the present invention.

DETAILED DESCRIPTION OF THE PREFERRED EMBODIMENT

An embodiment of a semiconductor light-emitting element according to the present invention will be described in detail, with reference to the accompanying drawing.

As shown in the drawing, semiconductor light-emitting element 10 has layer or substrate 11 of a monocrystalline semiconductor of one conductivity type, e.g., an n conductivity type. Semiconductor layer 11 includes those semiconductor layers used in a conventional semiconductor light-emitting element, and can be made of a III-V Group compound semiconductor (e.g., GaP, GaAsP, AlGaAs, or GaN), a II-VI Group semiconductor (e.g., ZnS or ZnSe), or other compound semiconductors (e.g., SiC) according to a known technique, such as the Bridgeman method, epitaxial growth, or liquid-phase growth. Electrode 12 of a proper electrode material, such as an indium-germanium alloy is formed on the bottom surface of layer 11 to a thickness of 100 to 500 nm.

Langmuir-Blodgett (LB) film 13 (to be described in detail later) is formed on the top surface of layer 11. Patterned metallic material layer 14 having a thickness of 100 to 200 nm is formed on LB layer 13. A metal material having a large work function (e.g., 4 to 5 eV) is preferred for layer 14. Examples of such a metallic material are gold, nickel, copper, and chromium. Gold is most preferable.

LB film 13 is made of an organic material including an electron donative organic monomolecular compound whose longest absorption peak wavelength in the electron transition spectrum falls within the range of 300 to 600 nm. "Monomolecular compound" here means a compound which excludes polymers, and which has no plurality of repeating units, as does a polymer. Therefore, the molecular weight of the compound is not a matter of concern.

The longest absorption peak wavelength is determined as follows. An organic compound to be measured is dissolved in a proper solvent, such as chloroform, and the ultraviolet/visible spectrum of the organic compound is determined using a conventional automatic spectrophotometer. Among the spectral peaks measured by the spectrophotometer, a wavelength at which a peak having the longest wavelength exists is determined to be the longest absorption peak wavelength.

Examples of the electron donative monomolecular compound are a hydrazone compound, a pyrazoline compound, an oxazole compound, an oxydiazole compound, a carbazole compound, a tetrathiafulvalene compound, a naphthylamine compound, an indole compound, a triphenylmethane compound, and a merocyanine compound.

The term "lower" used with "group" such as "lower alkyl group" or "lower alkoxy group" here means a group having 1 to 8 carbon atoms.

The hydrazone compound can be represented by the general formula:

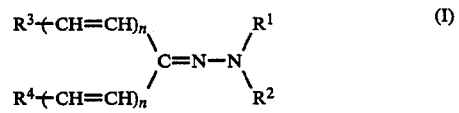

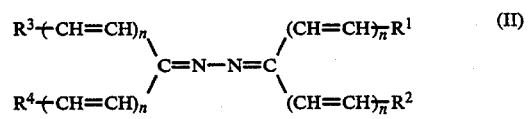

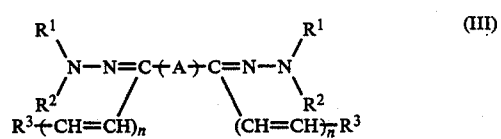

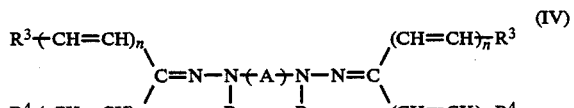

or

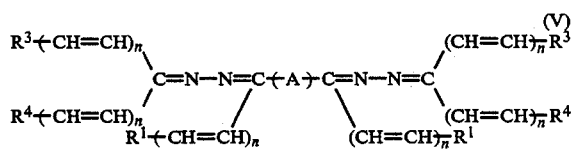

where each of $R^1$ to $R^4$ is independently a substituted or unsubstituted heterocyclic group, an aryl group, an aralkyl group, an alkyl group, or a hydrogen atom; $R^1$ and $R^2$, or $R^3$ and $R^4$ on an identical atom may constitute a ring; $R^1$ and $R^2$, or $R^3$ and $R^4$ are not simultaneously hydrogen atoms; A is a divalent organic group; and n is 0 or 1. Examples of the hydrazone compound are given below:

(I) Compound of General Formula (I)

(i) A compound defined by formula:

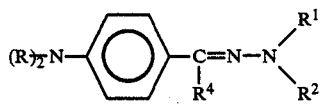

where R is a lower alkyl group; each of $R^1$ and $R^2$ is independently hydrogen atom, a lower alkyl group, an aryl group (especially phenyl group) or a heterocyclic group (e.g., pyridyl, quinolyl, benzothiazolyl, phthalazinyl, or acridinyl); and $R^4$ is hydrogen atom, a lower alkyl group or a di(lower alkyl)aminophenyl group. Specific examples are given by defining R, $R^4$, $R^1$, and $R^2$ as in table A below:

TABLE A

| No. | R | $R^4$ | $R^1$ | $R^2$ |
|---|---|---|---|---|
| (1) | Methyl | Hydrogen | Phenyl | Phenyl |
| (2) | Methyl | Hydrogen | Methyl | Phenyl |
| (3) | Methyl | Hydrogen | Ethyl | Phenyl |
| (4) | Methyl | Hydrogen | Phenyl | Phenyl |
| (5) | Ethyl | Hydrogen | Methyl | Phenyl |
| (6) | Ethyl | Hydrogen | Ethyl | Phenyl |
| (7) | Ethyl | Hydrogen | Phenyl | Hydrogen |
| (8) | Ethyl | Hydrogen | 2-pyridyl | Methyl |
| (9) | Ethyl | Hydrogen | 2-benzothiazolyl | Methyl |
| (10) | Ethyl | Hydrogen | 1-phthalazinyl | Hydrogen |
| (11) | Ethyl | Hydrogen | 1-phthalazinyl | Methyl |
| (12) | Ethyl | Hydrogen | 2-pyridyl | 2-pyridyl |
| (13) | Ethyl | Hydrogen | 9-acridinyl | Methyl |
| (14) | Ethyl | Methyl | 9-acridinyl | Phenyl |
| (15) | Ethyl | Methyl | 2-quinolyl | Phenyl |
| (16) | Methyl | p-diethylaminophenyl | 2-pyridyl | Methyl |
| (17) | Ethyl | p-diethylaminophenyl | 2-pyridyl | Methyl |
| (18) | Ethyl | p-diethylaminophenyl | 2-benzothiazolyl | Methyl |

(ii) A compound defined by formula:

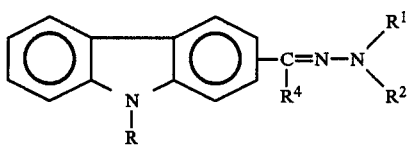

where R is a lower alkyl group; each of $R^1$ and $R^2$ is independently hydrogen atom, a lower alkyl group, an aryl group (especially phenyl group), an aralkyl group (especially benzyl group), or a heterocyclic group (especially pyridyl, benzothiazolyl, or

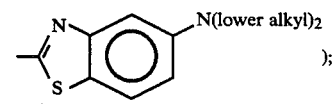);

and $R^4$ is hydrogen atom or a lower alkyl group. Specific examples are given by defining R, $R^4$, $R^1$, and $R^2$ as in Table B below:

TABLE B

| No. | R | $R^4$ | $R^1$ | $R^2$ |
|---|---|---|---|---|
| (1) | Methyl | Hydrogen | Phenyl | Phenyl |
| (2) | Methyl | Hydrogen | Methyl | Phenyl |
| (3) | Methyl | Hydrogen | Ethyl | Phenyl |
| (4) | Ethyl | Hydrogen | Phenyl | Phenyl |
| (5) | Ethyl | Hydrogen | Methyl | Phenyl |
| (6) | Ethyl | Hydrogen | Ethyl | Phenyl |
| (7) | Ethyl | Hydrogen | 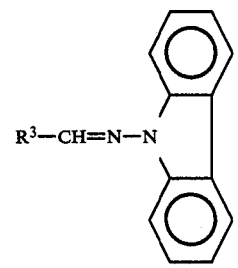 | Methyl |
| (8) | Ethyl | Hydrogen | 2-benzothiazolyl | Benzyl |
| (9) | Ethyl | Ethyl | 2-benzothiazolyl | Hydrogen |
| (10) | Ethyl | Methyl | 2-pyridyl | Methyl |

(iii) A compound defined by formula:

$$R^3-CH=N-N\begin{pmatrix}\text{fluorenyl}\end{pmatrix}$$

where $R^3$ is an aryl group (especially di(lower alkyl)aminophenyl) or a heterocyclic group (especially pyrenyl or carbazoyl). Specific examples are given by defining $R^3$ as in Table C below:

TABLE C

| No. | $R^3$ |
|---|---|
| (1) | p-dimethylaminophenyl |
| (2) | p-diethylaminophenyl |
| (3) | 3-carbazoyl |
| (4) | 1-pyrenyl |

(iv) A compound defined by formula:

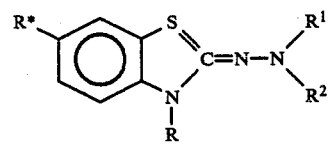

where R* is hydrogen atom or a di(lower alkyl) amino group R is hydrogen atom or a lower alkyl group; and each of $R^1$ and $R^2$ is independently a lower alkyl group, an aralkyl group (especially benzyl) or a heterocyclic group (especially, pyridyl, quinolyl, or acridinyl). Specific examples are given by defining R*, R, $R^1$, and $R^2$ as in Table D below:

TABLE D

| No. | R* | R | $R^1$ | $R^2$ |
|---|---|---|---|---|
| (1) | Diethylamino | Ethyl | 2-pyridyl | Methyl |
| (2) | Hydrogen | Hydrogen | 2-quinolyl | Ethyl |
| (3) | Hydrogen | Ethyl | 2-pyridyl | Methyl |
| (4) | Hydrogen | Ethyl | 9-acridinyl | Benzyl |

(v) A compound defined by formula:

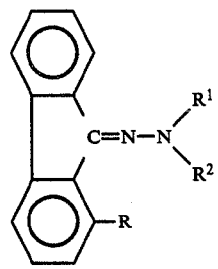

where R is hydrogen atom or a di(lower alkyl)amino group; and each of $R^1$ and $R^2$ is independently a lower alkyl group, an aryl group (especially, phenyl), or a heterocyclic group (especially, pyridyl or phthalazinyl). Specific examples are given by defining R, $R^1$, and $R^2$ as in Table E below:

TABLE E

| No. | R | $R^1$ | $R^2$ |
|---|---|---|---|
| (1) | Diethylamino | 2-pyridyl | Phenyl |
| (2) | Hydrogen | 1-phthalazinyl | Ethyl |

(vi) A compound defined by formula:

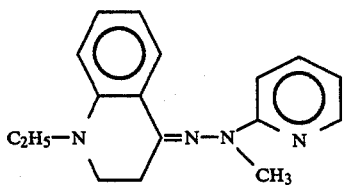

(vii) A compound defined by formula:

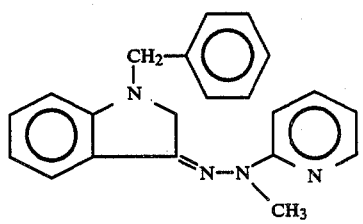

(viii) A compound defined by formula:

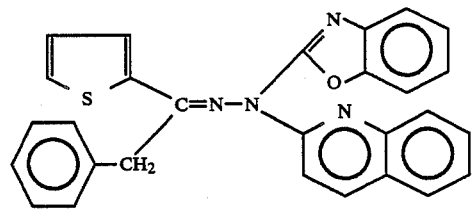

(ix) A compound defined by formula:

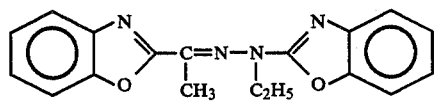

(II) Compound of General Formula (II)

A compound given by the following formula:

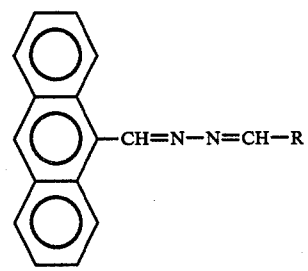

where R is a di(lower alkyl) aminophenyl group or a heterocyclic group (especially, pyrenyl or carbazoyl). Specific examples are given by defining R as in Table F below:

TABLE F

| No. | R |
|---|---|
| (1) | p-dimethylaminophenyl |
| (2) | p-diethylaminophenyl |
| (3) | 3-carbazoyl |
| (4) | 1-pyrenyl |

The pyrazoline compound used in the present invention can be defined by general formula (V):

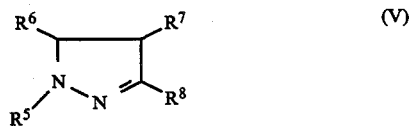

(V)

where each of $R^5$ to $R^8$ is independently hydrogen atom or an organic group such as an alkyl group, an alkoxy group, an ester group, an allyl group, an aryl group, an aralkyl group, or a heterocyclic group, and $R^5$ to $R^8$ are not simultaneously hydrogen atoms. Examples of the pyrazoline compound are as follows.

(I) A compound defined by formula:

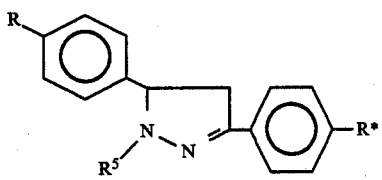

where R is a lower alkoxy group or di(lower alkyl)amino group; $R^5$ is a lower alkyl group or aryl group (especially, phenyl); and R* is a lower alkyl group, a lower alkoxy group, or a di(lower alkyl)amino group. Specific examples are given by defining R, $R^5$, and R* as in Table G below:

TABLE G

| No. | $R^5$ | R | R* |
|---|---|---|---|
| (1) | Phenyl | Dimethylamino | Dimethylamino |
| (2) | Phenyl | Dimethylamino | Methyl |
| (3) | Phenyl | Dimethylamino | Methoxy |
| (4) | Phenyl | Dimethylamino | Diethylamino |
| (5) | Phenyl | Diethylamino | Methyl |
| (6) | Phenyl | Diethylamino | Methoxy |
| (7) | Phenyl | Diethylamino | Ethoxy |
| (8) | Phenyl | Diethylamino | Dimethylamino |
| (9) | Phenyl | Diethylamino | Diethylamino |
| (10) | Phenyl | Methoxy | Ethyl |
| (11) | Phenyl | Methoxy | Dimethylamino |
| (12) | Phenyl | Methoxy | Diethylamino |
| (13) | Methyl | Dimethylamino | Dimethylamino |
| (14) | Methyl | Methoxy | Dimethylamino |

(II) A compound defined by formula:

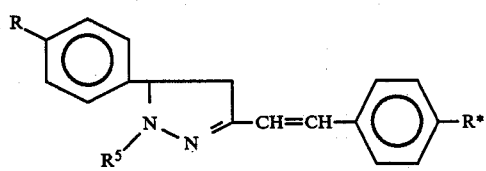

where R is a lower alkoxy group or a di(lower alkyl) amino group; $R^5$ is hydrogen atom, a lower alkyl group, or an aryl group (especially, phenyl); and R* is a lower alkyl group, a lower alkoxy group, or a di(lower alkyl)amino group. Specific examples are given by defining R, $R^5$, and R* as in Table H below:

TABLE H

| No. | $R^5$ | R | R* |
|---|---|---|---|
| (1) | Phenyl | Methoxy | Dimethylamino |
| (2) | Phenyl | Dimethylamino | Dimethylamino |
| (3) | Phenyl | Ethoxy | Methoxy |
| (4) | Phenyl | Dimethylamino | Ethoxy |
| (5) | Phenyl | Dimethylamino | Diethylamino |
| (6) | Phenyl | Ethoxy | Dimethylamino |
| (7) | Phenyl | Ethoxy | Ethoxy |
| (8) | Phenyl | Diethylamino | Dimethylamino |
| (9) | Phenyl | Diethylamino | Methoxy |
| (10) | Phenyl | Dimethylamino | Methyl |
| (11) | Phenyl | Diethylamino | Diethylamino |
| (12) | Hydrogen | Diethylamino | Dimethylamino |
| (13) | Hydrogen | Methoxy | Dimethylamino |
| (14) | Hydrogen | Dimethylamino | Dimethylamino |
| (15) | Methyl | Dimethylamino | Dimethylamino |
| (16) | Methyl | Dimethylamino | Methoxy |

The oxazole compound used in the present invention can be represented by general formula:

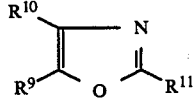

where each of $R^9$ to $R^{11}$ is independently a substrated or unsubstituted hydrocarbon group, especially phenyl group substituted or unsubstituted with a halogen (e.g., chlorine), an amino group (e.g., a di(lower alkyl)amino group or a di(lower alkoxy)amino group). Specific examples of the oxazole compound are:
2-(p-diethylaminophenyl)-4-(p-dimethylaminophenyl)-5-phenyloxazole,
2-(p-diethylaminophenyl)-4-(p-dimethoxyaminophenyl)-5-phenyloxazole,
2-(p-dimethylaminophenyl)-4-(p-diethylaminophenyl)-5-phenyloxazole,
2-(p-dimethylaminophenyl)-4-(p-dimethylaminophenyl)-5-(o-chlorophenyl)-oxazole,
2-(p-dimethylaminophenyl)-4-(p-methoxyphenyl)-5-(o-chlorophenyl)-oxazole,
2-(p-dipropylaminophenyl)-4-(p-dimethylaminophenyl)-5-phenyloxazole,
2-(p-dipropylaminophenyl)-4-(p-diethylaminophenyl)-5-phenyloxazole, and
2-(p-dipropylaminophenyl)-4-(p-methoxyphenyl)-5-phenyloxazole.

The oxydiazole compound used in the present invention is given by the following general formula:

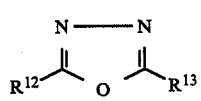

where each of $R^{12}$ and $R^{13}$ is independently a substituted or unsubstituted hydrocarbon group, especially, a phenyl group substituted with an amino group (e.g., a di(lower alkyl)amino group or a di(lower alkoxy)amino group) or with an alkoxy group (e.g., a lower alkoxy group). Examples of the oxydiazole compound are
2,5-bis(p-dimethylaminophenyl)-oxydiazole,
2,5-bis(p-dimethoxyaminophenyl)-oxydiazole,
2,5-bis(p-diethylaminophenyl)-oxydiazole,
2,5-bis(p-diethoxyaminophenyl)-oxydiazole,
2-(p-dimethylaminophenyl)-5-(p-diethylaminophenyl)-oxydiazole;
2-(p-methoxyphenyl)-5-(p-dimethylaminophenyl)-oxydiazole,
2-(p-ethoxyphenyl)-5-(p-dimethylaminophenyl)-oxydiazole,
2,5-bis(p-dimethylphenyl)-oxydiazole,
2,5-bis(p-diethoxyphenyl)-oxydiazole, and
2-(p-diethoxyaminophenyl)-5-(p-methoxyphenyl)-oxydiazole.

The carbazole compound used in the present invention can be represented by the following general formula:

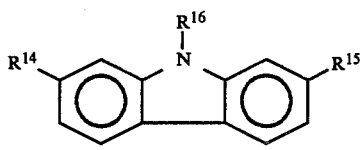

where each of $R^{14}$ and $R^{15}$ is independently a hydrogen atom or an alkyl group having 1 to 20 carbon atoms; and $R^{16}$ is a substituted or unsubstituted hydrocarbon group (especially, a lower alkyl group, an amino lower alkyl group, or a hydroxy lower alkyl group).

Examples of the carbazole compound are
2,7-didodecylcarbazole, 2,7-dioctadecylcarbazole,
2,7-dipentadecylcarbazole, 2,7-dihexadecylcarbazole,
2-dodecylcarbazole, 2-dioctadecylcarbazole,
7-hexadecylcarbazole, 2-methyl-7-dodecylcarbazole,
2-methyl-7-octadecylcarbazole,
2-methyl-7-hexadecylcarbazole,
2,7-didodecyl-9-methylcarbazole,
2,7-dioctadecyl-9-methyl-carbazole,
2,7-dipentadecyl-9-methylcarbazole,
2,7-didodecyl-9-aminoethyl-carbazole,
2,7-dioctadecyl-9-aminoethylcarbazole,
2,7-dipentadecyl-9-aminoethylcarbazole,
2,7-dihexadecyl-9-aminoethylcarbazole,
2,7-didodecyl-9-hydroxyethylcarbazole,
2,7-dioctadecyl-9-hydroxyethylcarbazole, and
2,7-dihexadecyl-9-hydroxyethylcarbazole.

The tetrathiafulvalene compound used in the present invention can be given by the following general formula:

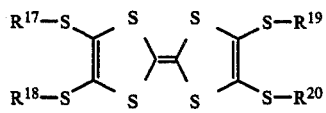

where each of $R^{17}$ to $R^{20}$ is independently a hydrogen atom or a substituted or unsubstituted hydrocarbon group (especially, a $C_1$–$C_{20}$ alkyl group, an amino $C_1$–$C_{20}$ alkyl group, a hydroxy $C_1$–$C_{20}$ alkyl group, or a carboxy $C_1$–$C_{20}$ alkyl group). Examples of the tetrathiafulvalene compound are tetrakis(ω-hydroxyoctadecylthia)tetrathiafulvalene,
tetrakis(ω-hydroxyhexadecylthia)tetrafulvalene,
tetrakis(ω-hydroxydodecylthia)tetrathiafulvalene,
tetrakis(ω-aminooctadecylthia)tetrathiafulvalene,
tetrakis(ω-aminohexadecylthia)tetrathiafulvalene,
tetrakis(ω-aminododecylthia)tetrathiafulvalene,
tetrakis(ω-carboxyloctadecylthia)tetrathiafulvalene,
tetrakis(ω-carboxylhexadecylthia)tetrafulvalene,
tetrakis(ω-carboxyldodecylthia)tetrathiafulvalence,
ω-hydroxyoctadecylthia-trimethylthiatetrathiafulvalene,
ω-aminooctadecylthia-trimethylthiatetrathiafulvalene, and
ω-carboxyloctadecylthia-trimethylthiatetrathiafulvalene.

The naphthylamine compound used in the present invention can be given by the following general formula:

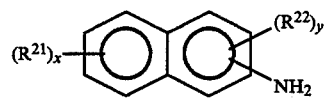

where each of $R^{21}$ and $R^{22}$ is independently a substituted or unsubstituted hydrocarbon group (especially, an arylazo group, preferably, a phenylazo group; a $C_1$–$C_{20}$ alkylphenylazo group; or a $C_1$–$C_{20}$ alkyloxyphenylazo group); x is 0 to 4; and y is 0 to 3. Examples of the naphthylamine compound are 1-phenylazo-2-naphthylamine,
1-(p-dodecylphenyl)azo-2-naphthylamine,
1-(p-octadecylphenyl)azo-2-naphthylamine,
1-(p-hexadecylphenyl)azo-2-naphthylamine,
1-(p-dodecyloxyphenyl)azo-2-naphthylamine,
1-(p-octadecyloxyphenyl)azo-2-naphthylamine,
1-(p-hexadecyloxyphenyl)azo-2-naphthylamine,
1,5-di(p-dodecyloxyphenyl)azo-2-naphthylamine,
1,5-di(p-octadecyloxyphenyl)azo-2-naphthylamine, and
1,5-di(p-hexadecyloxyphenyl)azo-2-naphthylamine.

The indole compound used in the present invention can be defined by the following general formula:

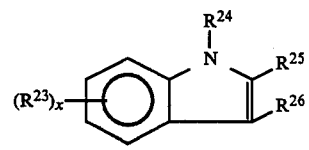

where $R^{23}$ is hydroxyl group, an amino group, or a carboxyl group; each of $R^{24}$ and $R^{26}$ is independently a hydrogen atom, or a hydrocarbon group which may be substituted with an amino group, hydroxyl group, carboxyl group or an alkyloxy group (especially, a $C_1$–$C_{20}$ alkyl group, a $C_1$–$C_{20}$ alkyl-phenyl group, or a $C_1$–$C_{20}$ alkyloxy-phenyl group); x is 0 to 4. $R^{24}$ is preferably a hydrogen atom or a lower alkyl group. Examples of the indole compound are
1-methyl-2-phenylindole, 2-dodecylindole,
2-octadecylindole, 2-(p-dodecyloxyphenyl)indole,
2-(p-octadecyloxyphenyl)indole,
2-(p-dodecylphenyl)indole,
1-methyl-2-dodecyl-4-hydroxyindole,
1-methyl-2-(p-dodecylphenyl)-4-hydroxyindole,
1-methyl-2-(p-dodecyloxyphenyl)-4-hydroxyindole, and
1-methyl-2-(p-octadecyloxyphenyl)-4-hydroxyindole.

The triphenylmethane compound used in the present invention can be defined by the following general formula:

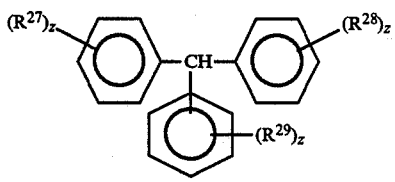

where each of $R^{27}$ to $R^{29}$ is independently an amino group (especially, a $C_1$–$C_{20}$ alkylamino group or di($C_1$–$C_{20}$ alkyl)amino group), or a substituted or unsubstituted hydrocarbon group (especially, a $C_1$–$C_{20}$ alkyl group or hydroxy $C_1-C_{20}$ alkyl group); and z is 0 to 5.
Examples of the triphenylmethane compound are
bis(4-diethylamino-2-methylphenyl)-pheneylmethane,
bis(4-dipropylamino-2-methylphenyl)-phenylmethane,
bis(4-didodecylamino-2-methylphenyl)-phenylmethane,
bis(4-dodecylamino-2-methylphenyl)-phenylmethane,
4-dodecylamino-phenyl-diphenylmethane,
bis(4-hydroxyethylphenyl)phenylmethane,
4-hydroxyethyl-diphenylmethane, and
4-hydroxydodecyl-diphenylmethane.

The merocyanine compound (including thio- and seleno-analogs thereof) used in the present invention can be defined by the following general formula:

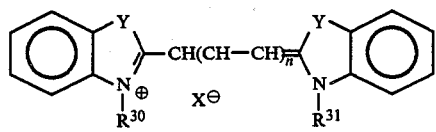

where each of $R^{30}$ and $R^{31}$ is independently a hydrocarbon having 1 to 20 carbon atoms (especially an alkyl group); $X^-$ is an anion (especially a halogen anion, a perhalogeno-acid anion, a sulfonic acid anion, or a trichloroacetic acid anion); Y is an oxygen atom, a sulfur atom, or a selenium atom (especially, oxygen or sulfur); and n is 0 or 1. Examples of the merocyanine compound are listed in Table I below by defining $R^{30}$, $R^{31}$, Y, X, and n.

TABLE I

| No. | $R^{30}$ | $R^{31}$ | Y | X | n |
|---|---|---|---|---|---|
| 1 | Octadecyl | Methyl | Oxygen | Chloric acid anion | 0 |
| 2 | Octadecyl | Methyl | Oxygen | Chloric acid anion | 1 |
| 3 | Dodecyl | Methyl | Oxygen | Chloric acid anion | 0 |
| 4 | Dodecyl | Methyl | Oxygen | Chloric acid anion | 1 |
| 5 | Octadecyl | Octadecyl | Oxygen | Chloric acid anion | 0 |
| 6 | Octadecyl | Octadecyl | Oxygen | Chloric acid anion | 1 |
| 7 | Octadecyl | Octadecyl | Sulfur | Chloric acid anion | 0 |
| 8 | Octadecyl | Octadecyl | Sulfur | Chloric acid anion | 1 |
| 9 | Dodecyl | Methyl | Sulfur | Chloric acid anion | 0 |
| 10 | Dodecyl | Methyl | Sulfur | Chloric acid anion | 1 |
| 11 | Octadecyl | Methyl | Oxygen | Perchloric acid anion | 0 |
| 12 | Octadecyl | Methyl | Oxygen | Perchloric acid anion | 1 |
| 13 | Dodecyl | Dodecyl | Oxygen | Perchloric acid anion | 0 |
| 14 | Dodecyl | Dodecyl | Oxygen | Perchloric acid anion | 1 |
| 15 | Octadecyl | Octadecyl | Sulfur | Perchloric acid anion | 0 |
| 16 | Octadecyl | Octadecyl | Sulfur | Perchloric acid anion | 1 |

In order to form an LB film from the electron donative organic monomolecular compound, a known method may be used. A method of forming an LB film is described, for example, in "Shin Jikken Kagaku Koza Vol. 18 "Interface and Colloid", Maruzene K.K., Japan, 1977, pp. 439–516, especially pp. 497–507. This method will be briefly described below. The upper major surface of semiconductor substrate 11 having electrode 14 on its lower major surface is cleaned (substrate 11 is dipped in a mixture of concentrated sulfuric acid and aqueous hydrogen peroxide to treat the surface, i.e., the so-called SH treatment). Cleaned substrate 11 is placed in an LB film formation apparatus. The aqueous phase in the apparatus is controlled and maintained at predetermined pH and temperature. An expanding solution dissolving the electron donative organic monomolecular compound is dripped on the aqueous phase surface to develope the monomolecular film. The solvent in the expanding solution is evaporated. While a surface pressure is maintained at a level such that the monomolecular film becomes a condensed film, vertical pulling or horizontal coating is repeated a plurality of times to form a multilayer film (LB film) of a plurality of monomolecular films on the upper surface of substrate 11. The LB film used in the present invention usually consists of 3 to 10 monomolecular films.

If it is difficult to form an LB film with the electron donative organic monomolecular compound alone, the compound may well be mixed with an organic compound which is known to form an LB film by itself. Examples of such an LB film-forming organic compound are: a fatty acid having 12 to 23 carbon atoms (e.g., stearic acid, arachic acid, and tricosanoic acid, or its metal salt (e.g., cadmium salt) or ester (e.g., vinyl stearate); polypeptide; polybenzyl-L-histidine; poly(imidazolylbenzyl-L-histidine); polybenzylglutamate; polyamide; a styrene-methylmethacrylate copolymer; poly(hydroxybenzoic acid); poly(methylmethacrylate); polyaniline; polycarbonate; polyethyleneterephthalate; and a mixture of at least one of these materials and the above-mentioned fatty acid. Other examples are also described in the above reference literature. A fatty acid or its salt is preferable. It should be noted that mixing of the LB film-forming organic compound does not influence the longest absorption peak wavelength.

The content of the LB film-forming compound in the resultant LB film is preferably 10 to 90% by weight, and more preferably up to 50% by weight.

The resultant LB film is dried sufficiently in an inert gas atmosphere of nitrogen, argon or the like.

Upon drying of the LB film, a metallic material is vapor deposited on the LB film through a deposition mask to form metal layer 14.

A semiconductor light-emitting element according to the present invention is thus prepared.

The present invention will be described by way of its Examples. An LB film forming apparatus used in Examples 1 to 11 and 13 to 25 was "Langmuire Trough 4" available from Joycelabel Inc.

EXAMPLE 1

A semiconductor substrate used in this Example was an n-type GaP substrate, doped with nitrogen at a concentration of $1 \times 10^{18}/cm^3$ and having an Au-Ge electrode on its lower surface. A hydrazone compound defined by the following formula:

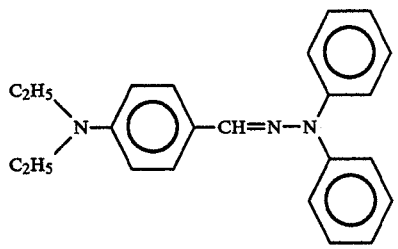

and having the longest absorption peak wavelength of 367 nm as measured in chloroform, stearic acid, and poly(imidazoylbenzyl-L-histidine) having a molecular weight of about 30,000 were mixed well at a weight ratio of 1:1:1. The resultant mixture was dissolved in a dichloroacetic acid-chloroform solvent mixture (a volume ratio of 1:5) at a concentration of 0.7 mg/ml, thereby preparing a monomolecular film expanding solution.

The aqueous phase of the LB film forming apparatus were set at pH 6.0 and 20° C., and a concentration of cadmium (II) salt was set to be 0.3 mM. The GaP substrate was then placed in the apparatus. 600 μl of the expanding solution were dripped on the aqueous phase surface to develop a monomolecular film on the aqueous phase and the surface pressure was maintained at 20 dyne/cm to stabilize the monomolecular film. The GaP substrate was then repeatedly immersed and pulled at a pulling rate of 1 mm/min to form an LB film consisting of five monomolecular films. The GaP substrate was left to stand in a dry nitrogen atmosphere for about 2 days to dry the LB film. A 20-nm thick gold electrode was then formed on the LB film, using the conventional vacuum deposition apparatus, thus preparing a desired light-emitting element.

A light emission peak at 565 nm in the resultant light-emitting element was observed and its current-voltage characteristics were found to be highly stable. The luminous efficacy at an application voltage of 5 V (a current of 25 mA) was about 0.2%, which was maintained for 30 days.

EXAMPLE 2

The same GaP substrate as in Example 1 was used except that the electrode was made of In-Ge.

The monomolecular film expanding solution was prepared as in Example 1, except that the hydrazone compound was a compound (the longest absorption peak wavelength of 360 nm as measured in chloroform) defined by the following formula:

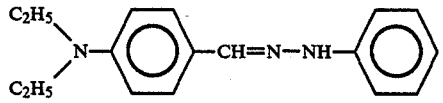

The aqueous phase and temperature of the LB film forming apparatus were set to be pH 6.0 and 20° C., and a concentration of cadmium (II) salt was set to be 0.5 mM. The GaP substrate was then placed in the apparatus. 500 μl of the expanding solution were dripped on the aqueous phase surface to develop a monomolecular film on the aqueous phase, and the surface pressure was maintained at 20 dyne/cm to stabilize the monomolecular film. The GaP substrate was then repeatedly immersed and pulled at a pulling rate of 1 mm/min to form an LB film consisting of five monomolecular films. The GaP substrate was left to stand in a dry nitrogen atmosphere for about 40 min to dry the LB film. A 20-nm thick gold electrode was then formed on the LB film, using the conventional vacuum deposition apparatus, thus preparing a desired light-emitting element.

A light emission peak at 565 nm in the resultant light-emitting element was observed and its current-voltage characteristics were found to be highly stable. The luminous efficacy at an application voltage of 5 V (a current of 25 mA) was about 0.2%, which was maintained for 30 days.

EXAMPLE 3

A light-emitting element was prepared as in Example 2, except that a semiconductor substrate used in this Example was a ZnS substrate doped with aluminum at a concentration of about 50 ppm, and that the ZnS substrate had an In-Ge electrode on the lower surface thereof.

A light emission peak at 465 nm in the resultant light-emitting element was observed and its current-voltage characteristics were found to be highly stable. The luminous efficacy at an application voltage of 5 V (a current of 40 mA) was about 0.3%, which was maintained for about one month.

EXAMPLE 4

A light-emitting element was prepared as in Example 3, except that the hydrazone compound was a compound (the longest absorption peak wavelength of 350 nm) defined by the following formula:

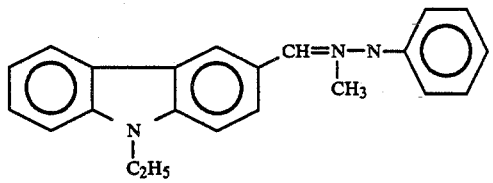

The luminous efficacy at an application voltage of 5 V (a current of 50 mA) was about 0.35%, which was maintained for about one month.

EXAMPLE 5

1-phenyl-3-(p-diethylaminostyryl)-5-(p-diethylaminophenyl)-pyrazoline (the longest absorption peak wavelength of 400 nm measured in chloroform), stearic acid, and poly(imidazoylbenzyl-L-histidine) (a molecular weight of about 30,000) were mixed well at a weight ratio of 1:1:1. The resultant mixture was dissolved in a dichloroacetic acid-chloroform solvent mixture (a volume ratio of 1:5) at a concentration of 0.6 mg/ml, thereby preparing a monomolecular film expanding solution.

A light-emitting element was prepared as in Example 1, except that the above expanding solution was used.

A light emission peak at 565 nm in the resultant light-emitting element was observed and its current-voltage characteristics were found to be highly stable. The luminous efficacy at an application voltage of 5 V (a current of 27 mA) was about 0.75%, which was maintained for about one month.

EXAMPLE 6

A ZnS substrate as in Example 3 was used.

The pyrazoline compound as in Example 5 was mixed with a mixture of poly(methylmethacrylate) (a molecular weight of 50,000) and stearic acid at a weight ratio of 3:1. The resultant mixture was dissolved in a tetrahydrofuran-chloroform solvent mixture (a volume ratio of 1:3) at a concentration of 0.5 mg/ml, thereby preparing an expanding solution.

An LB film consisting of five monomolecular films was formed using the above expanding solution in the same manner as in Example 1, and then a gold electrode was formed as in Example 1.

A light emission peak at 465 nm in the resultant light-emitting element was observed and its current-voltage characteristics were found to be highly stable. The luminous efficacy at an application voltage of 5 V (a current of 30 mA) was about 0.3%, which was maintained for about one month.

EXAMPLE 7

A semiconductor substrate used in Example 7 is the same as in Example 1.

1-phenyl-3-(p-dimethylaminostyryl)-5-(p-dimethylaminophenyl)pyrazoline (the longest absorption peak wavelength of 400 nm as measured in chloroform) and vinyl stearate were mixed well at a weight ratio of 1:1. The resultant mixture was dissolved in a tetrahydrofuran-chloroform solvent mixture (a volume ratio of 1:3) at a concentration of 0.6 mg/ml, thereby preparing a monomolecular film expanding solution.

The aqueous phase and temperature of the LB film forming apparatus were set to be pH 6.0 and 20° C., and a concentration of cadmium (II) salt was set to be 0.5 mM. he GaP substrate was placed in the apparatus. 500 μl of the expanding solution were dripped on the aqueous phase surface to develop a monomolecular film on the water phase, and the surface pressure was maintained at 18 dyne/cm to stabilize the monomolecular film. The GaP substrate was then repeatedly pulled at a pulling rate of 1 mm/min to form a Y type LB film consisting of five monomolecular films. The GaP substrate was left to stand in a dry nitrogen atmosphere for about 40 min to dry the LB film. A 30-nm thick gold electrode was then formed on the LB film, using the conventional vacuum deposition apparatus, thus preparing a desired light-emitting element.

A light emission peak at 565 nm in the resultant light-emitting element was observed and its current-voltage characteristics were found to be highly stable. The luminous efficacy at an application voltage of 5 V (a current of 25 mA) was about 0.8%, which was maintained for 30 days.

EXAMPLE 8

A ZnS substrate as in Example 3 was used.

The pyrazoline compound as in Example 7 was mixed with a mixture of poly(methylmethacrylate) (a molecular weight of 50,000) and stearic acid at a weight ratio of 3:1. The resultant mixture was dissolved in a tetrahydrofuran-chloroform solvent mixture (a volume ratio of 1:3) at a concentration of 0.5 mg/ml, thereby preparing an expanding solution.

A Y type LB film consisting of seven monomolecular films was formed using the above expanding solution in the same manner as in Example 7, and then a gold electrode was formed as in Example 7 to prepare a desired light-emitting element.

A light emission peak at 465 nm in the resultant light-emitting element was observed and its current-voltage characteristics were found to be highly stable. The luminous efficacy at an application voltage of 5 V (a current of 40 mA) was about 0.3%, which was maintained for about one month.

EXAMPLE 9

A light-emitting element was prepared as in Example 8, except that the pyrazoline compound was 1-phenyl-3-(p-methoxystyryl)-5-(p-dimethylaminophenyl)-pyrazoline (the longest absorption peak wavelength of 390 nm as measured in chloroform).

The luminous efficacy at a application voltage of 5 V (a current of 50 mA) was about 0.3%, which was maintained for about one month.

EXAMPLE 10

A semiconductor substrate used in Example 10 was a ZnS substrate doped with aluminum at a concentration of 60 ppm. The ZnS substrate had an In-Ge electrode on its lower major surface.

1-phenyl-3-(p-diethylaminophenyl)-5-(p-dimethylaminophenyl)pyrazoline (the longest absorption peak wavelength of 400 nm as measured in chloroform) and poly(benzylglutamate) (a molecular weight of about 80,000) were mixed well at a weight ratio of 1:1. The resultant mixture was dissolved in a dimethylformamide-chloroform solvent mixture (a volume ratio of 1:4) at a concentration of 0.6 mg/ml, thereby preparing an expanding solution.

Using this expanding solution, a Y type LB film having five monomolecular films was formed in the same manner as in Example 7 (except that the surface pressure was 20 dyne/cm), and a gold electrode was formed on the LB film, thereby preparing a desired light-emitting element.

A light emission peak at 465 nm in the resultant light-emitting element was observed and its current-voltage characteristics were found to be stable. The luminous efficacy at an application voltage of 5 V (a current of 30 mA) was about 0.38%, which was maintained for a long period of time.

EXAMPLE 11

A semiconductor substrate used in Example 11 was a ZnS substrate as in Example 3.

2-phenyl-3-(p-dimethylaminophenyl)-5-(p-diethylaminophenyl)-oxazole (the longest absorption peak wavelength of 360 nm as measured in chloroform) and poly(benzylglutamate) (a molecular weight of about 80,000) were mixed well at a weight ratio of 1:1. The resultant mixture was dissolved in a tetrahydrofuran-chloroform solvent mixture (a volume ratio of 1:3) at a concentration of 0.5 mg/ml, thereby preparing an expanding solution.

The ZnS substrate was placed in the LB film forming apparatus. 500 μl of the expanding solution were dripped on the aqueous phase surface to develop a monomolecular film on the aqueous phase in the same manner as in Example 1. The surface pressure was maintained at 20 dyne/cm to stabilize the monomolecular film. The ZnS substrate was then repeatedly pulled at a pulling rate of 1 mm/min to form an LB film consisting of five monomolecular films. The ZnS substrate was left to stand in a dry nitrogen atmosphere for about 30 min to dry the LB film. A 50-nm thick gold electrode was then formed on the LB film, thus preparing a desired light-emitting element.

The luminous efficacy at an application voltage of 5 V (a current of 40 mA) was about 0.3%, which was maintained for about one month.

EXAMPLE 12

A semiconductor substrate used in Example 12 was a ZnSe substrate doped with aluminum at concentration of 60 ppm. An In-Ge electrode was formed on the lower major surface of the ZnSe substrate.

2-phenyl-3-(p-dimethylaminophenyl)-5-(p-dipropylaminophenyl)-oxazole (the longest absorption peak wavelength of 360 nm as measured in chloroform) was mixed with poly(benzyl-L-histidine) at a weight ratio of 1:1. The mixture was dissolved in a dichloroacetic acid-chloroform solvent mixture (a volume ratio of 1:4) at a concentration of 1 mg/ml, thereby preparing an expanding solution.

The expanding solution was developed on a 0.25 mM aqueous solution of cadmium chloride to form a monomolecular film on the solution surface. The monomolecular film was compressed to a surface pressure of 25 dyne/cm. A portion of the monomolecular film on the solution surface was separated by a teflon partition. This portion corresponded to the surface area of the substrate. While the ZnSe substrate having a monomolecular stearic acid LB film previously formed by vertical dipping on its upper major surface was maintained horizontally, the substrate was gently brought into contact with the monomolecular film portion on the surface of the solution corresponding to the surface area of the substrate. The substrate was then slowly pulled from the solution surface, transferring the monomolecular film portion thereto. The above operation was repeated to form a multilayer LB film consisting of one stearic acid monomolecular layer and six mixture layers on the ZnSe substrate. The resultant LB film was dried and a gold electrode was formed on the LB film to prepare a desired light-emitting element.

A light emission peak at 465 nm in the resultant light-emitting element was observed and its current-voltage characteristics were found to be stable. The luminous efficacy at an application voltage of 6 V (a current of 25 mA) was about 0.37%, which was maintained for a long period of time.

EXAMPLE 13

A GaP substrate as in Example 1 was used, except that a doped nitrogen concentration was $1.5 \times 10^{18}/cm^3$.

2,5-bis(p-dimethylaminophenyl)-oxydiazole (the longest absorption peak wavelength of 350 nm as measured in chloroform) was mixed with vinyl stearate at a weight ratio of 1:1. The resultant mixture was dissolved in a tetrahydrofuran-chloroform solvent mixture (a volume ratio of 1:3) at a concentration of 0.6 mg/ml, thereby preparing an expanding solution.

Using this expanding solution, an LB film consisting of five monomolecular films on the GaP substrate was formed under the same conditions as in Example 11. A gold electrode was then formed on the LB film to prepare a desired light-emitting element.

A light emission peak at 565 nm in the resultant light-emitting element was observed and its current-voltage characteristics were found to be highly stable. The luminous efficacy at an application voltage of 5 V (a current of 25 mA) was about 0.8%, which was maintained for 30 days.

EXAMPLE 14

A ZnS substrate as in Example 3 was used in Example 14.

The oxydiazole compound used in Example 13 was mixed with a mixture of poly(methylmethacrylate) (a molecular weight of 50,000) and stearic acid at a weight ratio of 1:1. The weight ratio of polymethylmethacrylate and stearic acid was 3:1. The resultant mixture was dissolved in a tetrahydrofuran-chloroform solvent mixture (a volume ratio of 1:3) at a concentration of 0.5 mg/ml, thereby preparing an expanding solution.

A Y type LB film consisting of five monomolecular films was formed on the ZnS substrate in the same manner as in Example 11. A desired light-emitting element was then prepared as in Example 11.

A light emission peak at 465 nm in the resultant light-emitting element was observed and its current-voltage characteristics were found to be stable. The luminous efficacy at an application voltage of 5 V (a current of 40 mA) was about 0.32%, which was maintained for about 40 days.

EXAMPLE 15

2,5-bis(p-diethylaminophenyl)-oxydiazole (the longest absorption peak wavelength of 360 nm as measured in chloroform), stearic acid, and poly(imidazolyl-benzyl-L-histidine) (a molecular weight of about 30,000) were mixed at a weight ratio of 1:1:1. The resultant mixture was dissolved in a tetrahydrofuran-chloroform solvent mixture (a volume ratio of 1:3) at a concentration of 0.5 mg/ml, thereby preparing an expanding solution.

An LB film consisting of five monomolecular films formed on the GaP substrate was formed in the same manner as in Example 1, and a desired light-emitting element was formed as in Example 1.

A light emission peak at 565 nm in the resultant light-emitting element was observed and its current-voltage characteristics were found to be stable. The luminous efficacy at an application voltage of 5 V (a current of 22 mA) was about 0.38%, which was maintained for about one month.

EXAMPLE 16

An n-type GaP substrate as in Example 1 was used in this Example.

77 mg of tetrakis($\omega$-hydroxyoctadecylthia)tetrathiafulvalene (the longest absorption peak wavelength of 390 nm) and 70 mg of stearic acid were dissolved in 100 ml of chloroform to prepare an expanding solution.

The aqueous phase and temperature of the LB film forming apparatus were set to be pH 6.5 and 20° C., and a concentration of cadmium (II) salt was set to be 0.25 mM. The GaP substrate was then placed in the apparatus. 200 $\mu$l of the expanding solution were dripped to develop a monomolecular film on the aqueous phase, and the surface pressure was maintained at 20 dyne/cm to stabilize the monomolecular film. The GaP substrate was then repeatedly pulled at a pulling rate of 1 mm/min to form an LB film consisting of five monomolecular films. The GaP substrate was left to stand in a dry nitrogen atmosphere for about 2 days to dry the LB film. A 20-nm thick gold electrode was then formed on the LB film, using the conventional vacuum deposition apparatus, thus preparing desired light-emitting element.

A light emission peak at 565 nm in the resultant light-emitting element was observed and its current-voltage characteristics were found to be stable. The luminous efficacy at an application voltage of 5 V (a current of 26 mA) was about 0.35%, which was maintained for about one month. It was thus found that the light-emitting element in Example 16 had stability against deterioration over time.

EXAMPLE 17

A light-emitting element was prepared as in Example 16, except that a ZnSe substrate doped with aluminum at a concentration of about 50 ppm and having an In-Ge electrode on the lower major surface thereof was used.

A light emission peak at 465 nm in the resultant light-emitting element was observed and its current-voltage characteristics were found to be stable. The luminous efficacy at an application voltage of 5 V (a current of 40 mA) was about 0.38%, which was maintained for about one month.

EXAMPLE 18

50 mg of 1-phenylazo-2-naphthylamine (the longest absorption peak wavelength of 440 nm as measured in chloroform) and 50 mg of stearic acid were dissolved in 100 ml of chloroform to prepare an expanding solution.

A desired light-emitting element was prepared in the same manner as in Example 16, except that the above developing solution was used.

A light emission peak at 565 nm in the resultant light-emitting element was observed and its current-voltage characteristics were found to be stable. The luminous efficacy at an application voltage of 5 V (a current of 24 mA) was about 0.33%, which was maintained for about one month.

EXAMPLE 19

A light-emitting element was prepared as in Example 18, except that a ZnSe substrate doped with aluminum at a concentration of about 50 ppm and having an In-Ge electrode on the lower major surface thereof was used.

A light emission peak at 465 nm in the resultant light-emitting element was observed and its current-voltage characteristics were found to be stable. The luminous efficacy at an application voltage of 5 V (a current of 37 mA) was about 0.35%, which was maintained for about one month.

EXAMPLE 20

50 mg of 1-methyl-2-phenylindole (the longest absorption peak wavelength of 300 nm measured in chloroform) and 50 mg of stearic acid were dissolved in 100 ml of chloroform to prepare an expanding solution.

A desired light-emitting element was prepared in the same manner as in Example 16, except that the above developing solution was used.

A light emission peak at 565 nm in the resultant light-emitting element was observed and its current-voltage characteristics were found to be stable. The luminous efficacy at an application voltage of 5 V (a current of 20 mA) was about 0.25%, which was maintained for about one month.

EXAMPLE 21

The same operation as in Example 20 was performed except that a substrate as in Example 19 was used, thereby preparing a desired light-emitting element.

A light emission peak at 465 nm in the resultant light-emitting element was observed and its current-voltage characteristics were found to be stable. The luminous efficacy at an application voltage of 5 V (a current of 30 mA) was about 0.27%, which was maintained for about one month.

EXAMPLE 22

30 mg of bis(4-diethylamino-2-methylphenyl)-phenylmethane (the longest absorption peak wavelength of 310 nm measured in chloroform) and 50 mg of stearic acid were dissolved in 100 ml of chloroform to prepare an expanding solution.

A desired light-emitting element was prepared in the same operation as in Example 16, except that the above developing solution was used.

A light emission peak at 565 nm in the resultant light-emitting element was observed and its current-voltage characteristics were found to be stable. The luminous efficacy at an application voltage of 5 V (a current of 21 mA) was about 0.26%, which was maintained for about one month.

EXAMPLE 23

A desired light-emitting element was prepared as in Example 22, except that a ZnSe substrate as in Example 19 was used.

A light emission peak at 465 nm in the resultant light-emitting element was observed and its current-voltage characteristics were found to be stable. The luminous efficacy at an application voltage of 5 V (a current of 32 mA) was about 0.29%, which was maintained for about one month.

EXAMPLE 24

50 mg of merocyanine compound (the longest absorption peak wavelength of 525 nm measured in chloroform) of No. 16 in Table I and 50 mg of stearic acid were dissolved in 100 ml of chloroform to prepare an expanding solution. The maximum absorption peak wavelength of the merocyanine compound in the LB film was shifted to 600 nm since J aggregation occurred.

A desired light-emitting element was prepared in the same manner as in Example 16, except that the above developing solution is used.

A light emission peak at 565 nm in the resultant light-emitting element was observed and its current-voltage characteristics were found to be stable. The luminous efficacy at an application voltage of 5 V (a current of 22 mA) was about 0.24%, which was maintained for about one month.

EXAMPLE 25

A desired light-emitting element was prepared in the same operation as in Example 24, except that a ZnSe substrate as in Example 19 was used.

A light emission peak at 465 nm in the resultant light-emitting element was observed and its current-voltage characteristics were found to be stable. The luminous efficacy at an application voltage of 5 V (a current of 36 mA) was about 0.29%, which was maintained for about one month.

COMPARATIVE EXAMPLE 1

Stearic acid was dissolved in chloroform at a concentration of 0.3 mg/ml to prepare an expanding solution.

A light-emitting element was prepared as in Example 1, except that the above expanding solution was used.

A light emission peak at 565 nm in the resultant light-emitting element was observed but its luminous efficacy was as low as about 0.05% at an application voltage of 5 V (a current of 15 mA).

COMPARATIVE EXAMPLE 2

100 mg of a phthalocyanine derivative which is electron donative but has the longest absorption peak wavelength of 680 nm and 50 mg of stearic acid were dissolved in 200 ml of chloroform to prepare an expanding solution.

A light-emitting element was prepared in the same manner as in Example 16, except that the above developing solution was used.

A light emission peak at 565 nm in the resultant light-emitting element was observed and its current-voltage characteristics were found to be stable. However, the luminous efficacy at an application voltage of 5 V (a current of 30 mA) was as low as about 0.15%.

COMPARATIVE EXAMPLE 3

30 mg of a styrene-methylmethacrylate alternating copolymer which is electron donative but has the longest absorption peak wavelength of 265 nm and 50 mg of stearic acid were dissolved in 100 ml of chloroform to prepare an expanding solution.

A light-emitting element was prepared in the same manner as in Example 16, except that the above expanding solution as used.

A light emission peak at 565 in the resultant light-emitting element was observed and its current-voltage characteristics were found to be stable. However, the luminous efficacy at an application voltage of 5 V (a current of 25 mA) was as low as about 0.10%.

COMPARATIVE EXAMPLE 4

40 mg of octadecyl-7,7,8,8-tetracyanoquinodimethane which has the longest absorption peak wavelength of 410 nm but is an electron accepting compound and 50 mg of stearic acid were dissolved in 100 ml of chloroform to prepare an expanding solution.

A light-emitting element was prepared in the same manner as in Example 16, except that the above developing solution was used.

A light emission peak at 565 nm in the resultant light-emitting element was observed, but its current-voltage characteristics were relatively unstable. The luminous efficacy at an application voltage of 5 V (a current of 35 mA) was as low as about 0.09%.

According to the present invention as described above, there is provided a light-emitting element of a metal/LB film/semiconductor junction structure having a high luminous efficacy, good dynamic characteristics, and light-emission stability against deterioration over time.

What is claimed is:
1. A semiconductor light-emitting element of a metal-/organic film/semiconductor junction structure, comprising:
   (a) a semiconductor layer;
   (b) an organic Langmuir-Blodgett thin film formed on the semiconductor layer and comprising an electron donative organic monomolecular compound whose longest absorption peak wavelength in an electron transition spectrum falls within a range of 300 nm to 600 nm; and
   (c) a layer of metallic material formed on the thin film.
2. An element according to claim 1, wherein the electron donative organic monomolecular compound is a hydrazone compound defined by the general formula:

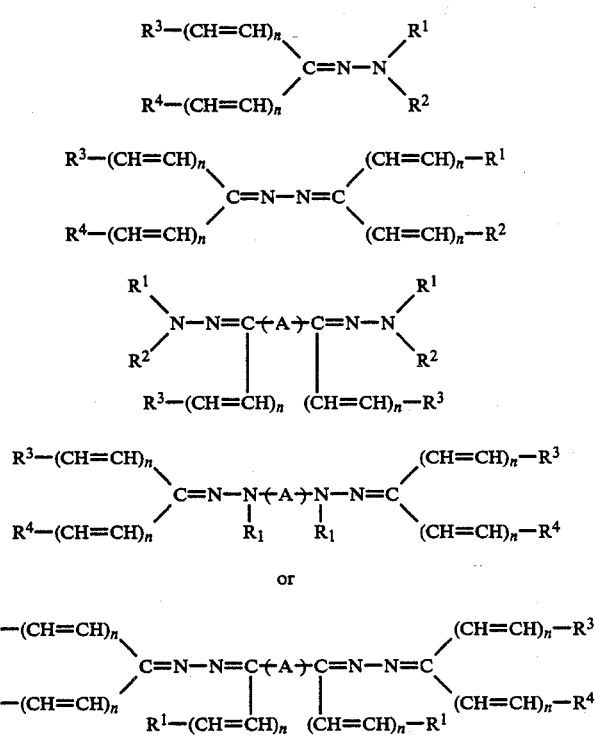

where each of $R^1$ to $R^4$ is independently a substituted or unsubstituted heterocyclic group, an aryl group, an aralkyl group, an alkyl group, or a hydrogen atom; in which $R^1$ and $R^2$, or $R^3$ and $R^4$ on the same atom may constitute a ring; $R^1$ and $R^2$, or $R^3$ and $R^4$ are not simultaneously hydrogen atoms; A is an organic group having a valence of 2; and n is 0 or 1.

3. An element according to claim 1, wherein the electron donative organic monomolecular compound is a pyrazoline compound defined by:

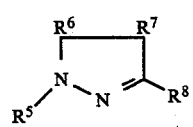

where each of $R^5$ to $R^8$ is independently a hydrogen atom or an organic group and $R^5$ to $R^8$ are not simultaneously hydrogen atoms.

4. An element according to claim 1, wherein the electron donative organic monomolecular compound is an oxazole compound defined by:

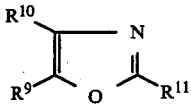

wherein each of $R^9$ to $R^{11}$ is independently a substituted or unsubstituted hydrocarbon group.

5. An element according to claim 1, wherein the electron donative organic monomolecular compound is an oxydiazole compound defined by:

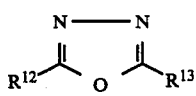

where each of $R^{12}$ or $R^{13}$ is independently a substituted or unsubstituted hydrocarbon group.

6. An element according to claim 1, wherein the electron donative organic monomolecular compound is a carbazole compound defined by:

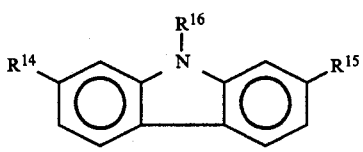

where each of $R^{14}$ and $R^{15}$ is independently a hydrogen atom or an alkyl group having 1 to 20 carbon atoms; and $R^{16}$ is a substituted or unsubstituted hydrocarbon group.

7. An element according to claim 1, wherein the electron donative organic monomolecular compound is a tetrathiafulvalene compound defined by:

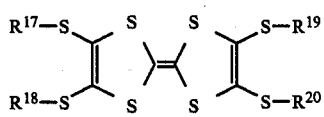

where each of $R^{17}$ to $R^{20}$ is independently a hydrogen atom or a substituted or unsubstituted hydrocarbon group.

8. An element according to claim 1, wherein the electron donative organic monomolecular compound is a naphthylamine compound defined by:

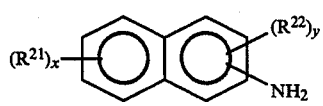

where each of $R^{21}$ and $R^{22}$ is independently a substituted or unsubstituted hydrocarbon group; x is 0 to 4; and y is 0 to 3.

9. An element according to claim 1, wherein the electron donative organic monomolecular compound is an indole compound defined by:

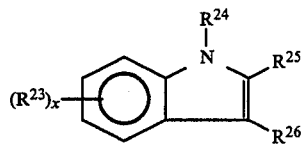

where $R^{23}$ is a hydroxyl group, an amino group, or a carboxyl group; each of $R^{24}$ and $R^{25}$ is independently a hydrogen atom or a substituted or unsubstituted hydrocarbon group; and x is 0 to 4.

10. An element according to claim 1, wherein the electron donative organic monomolecular compound is a triphenylmethane compound defined by:

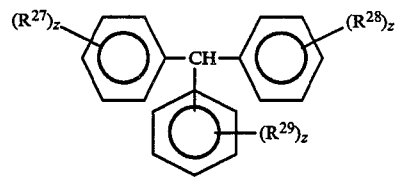

where each of $R^{27}$ to $R^{29}$ is independently an amino group or a substituted or unsubstituted hydrocarbon group.

11. An element according to claim 1, wherein the electron donative organic monomolecular compound is a merocyanine compound defined by:

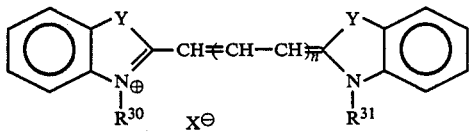

where each of $R^{30}$ and $R^{31}$ is independently a hydrocarbon having 1 to 20 carbon atoms; $X^-$ is an anion; Y is an oxygen atom, a sulfur atom, or selenium atom; and n is 0 or 1.

12. An element according to claim 2, wherein the hydrazone compound is defined by:

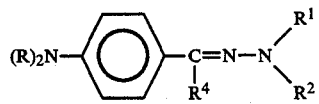

where R is a lower alkyl group; each of $R^1$ and $R^2$ is independently a hydrogen atom, a lower alkyl group, an aryl group or a heterocyclic group; and $R^4$ is a hydrogen atom, a lower alkyl group or a di(lower alkyl)aminophenyl group.

13. An element according to claim 2, wherein the hydrazone compound is defined by:

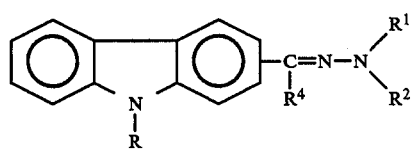

where R is a lower alkyl group; each of $R^1$ and $R^2$ is independently a hydrogen atom, a lower alkyl group, an aryl group, an aralkyl group, or a heterocyclic group; and $R^4$ is a hydrogen atom or a lower alkyl group.

14. An element according to claim 2, wherein the hydrazone compound is defined by:

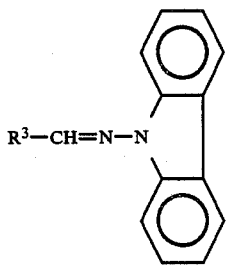

where $R^3$ is an aryl group or a heterocyclic group.

15. An element according to claim 2, wherein the hydrazone compound is defined by:

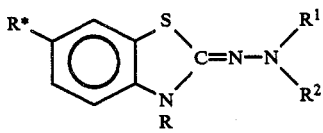

where $R^*$ is a hydrogen atom or a di(lower alkyl)amino group; R is a hydrogen atom or a lower alkyl group; and each of $R^1$ and $R^2$ is independently a lower alkyl group, an aralkyl group or a heterocyclic group.

16. An element according to claim 2, wherein the hydrazone compound is defined by:

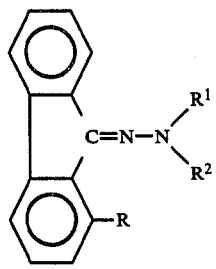

where R is a hydrogen atom or a di(lower alkyl)amino group; and each of $R^1$ and $R^2$ is independently a lower alkyl group, an aryl group, or a heterocyclic group.

17. An element according to claim 2, wherein the hydrazone compound is defined by:

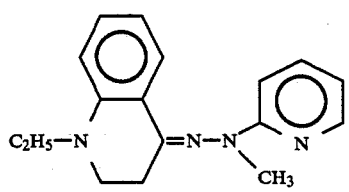

-continued

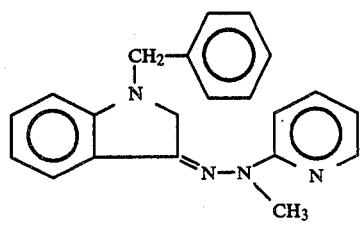

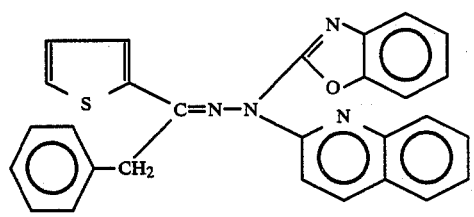

or

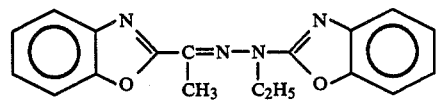

18. An element according to claim 2, wherein the hydrazone compound is defined by:

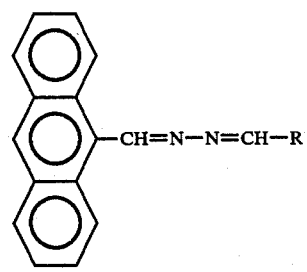

where R is a di(lower alkyl) aminophenyl group or a heterocyclic group.

19. An element according to claim 3, wherein the pyrazoline compound is defined by:

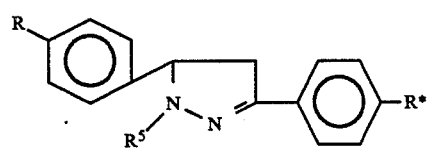

where R is a lower alkoxy group or a di(lower alkyl)amino group; $R^5$ is a lower alkyl group or an aryl group; and $R^*$ is a lower alkyl group, a lower alkoxy group, or a di(lower alkyl)amino group.

20. An element according to claim 3, wherein the pyrazoline compound is defined by:

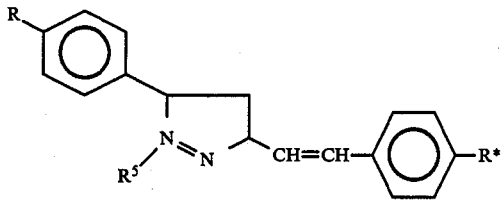

where R is a lower alkoxy group or a di(lower alkyl)amino group; $R^5$ is a lower alkyl group or an aryl group; and R* is is a lower alkyl group, a lower alkoxy group, or a di(lower alkyl)amino group.

21. An element according to claim 4, wherein each of $R^9$ to $R^{11}$ is independently a phenyl group which may be substituted with a halogen atom, a di(lower alkyl)amino group, a di(lower alkoxy)amino group or a lower alkoxy group.

22. An element according to claim 5, wherein each of $R^{12}$ and $R^{13}$ is independently a phenyl group substituted with a di(lower alkyl)amino group, a di(lower alkoxy)amino group or a lower alkoxy group.

23. An element according to claim 6, wherein $R^{16}$ is a hydrogen atom, a lower alkyl group, an amino lower alkyl group, or a hydroxy lower alkyl group.

24. An element according to claim 7, wherein each of $R^{17}$ to $R^{20}$ is independently a hydrogen atom, a $C_1$-$C_{20}$ alkyl group, an amino $C_1$-$C_{20}$ alkyl group, a hydroxy $C_1$-$C_{20}$ alkyl group, or a carboxy $C_1$-$C_{20}$ alkyl group.

25. An element according to claim 8, wherein each of $R^{21}$ and $R^{22}$ is independently phenylazo group, a $C_1$-$C_{20}$ alkylphenylazo group, or a $C_1$-$C_{20}$ alkyloxyazo group.

26. An element according to claim 9, wherein $R^{24}$ is a hydrogen atom or a lower alkyl group; and each of $R^{25}$ and $R^{26}$ is independently a $C_1$-$C_{20}$ alkyl group, a $C_1$-$C_{20}$ alkylphenyl group, or a $C_1$-$C_{20}$ alkyloxyphenyl group.

27. An element according to claim 10, wherein each of $R^{27}$ to $R^{29}$ is independently a $C_1$-$C_{20}$ alkylamino group, or a $C_1$-$C_{20}$ alkyl group.

28. An element according to claim 11, wherein each of $R^{30}$ and $R^{31}$ is independently a $C_1$-$C_{20}$ alkyl group; and Y is an oxygen or sulfur atom.

29. An element according to claim 1, wherein the organic material contains a Langmuir-Blodgett film forming compound in addition to the electron donative organic monomolecular compound.

* * * * *